United States Patent
Floyd et al.

(10) Patent No.: US 10,417,803 B2
(45) Date of Patent: Sep. 17, 2019

(54) MULTIPLE-PASS RENDERING OF A DIGITAL THREE-DIMENSIONAL MODEL OF A STRUCTURE

(71) Applicant: THE BOEING COMPANY, Chicago, IL (US)

(72) Inventors: Joseph Frank Floyd, University Place, WA (US); Patrick James Eames, Newcastle, WA (US); Brent Louis Hadley, Kent, WA (US); Robert James Martin, Seattle, WA (US); Nicholas Shepherd, Issaquah, WA (US); Ivan Rumsey, Tacoma, WA (US); Jeremy David Scott, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/185,785

(22) Filed: Jun. 17, 2016

(65) Prior Publication Data
US 2017/0365086 A1    Dec. 21, 2017

(51) Int. Cl.
| | |
|---|---|
| *G06T 15/00* | (2011.01) |
| *G06T 17/10* | (2006.01) |
| *G06T 17/20* | (2006.01) |
| *G06T 15/20* | (2011.01) |
| *G06T 1/60* | (2006.01) |
| *G06T 15/40* | (2011.01) |

(52) U.S. Cl.
CPC .............. *G06T 15/005* (2013.01); *G06T 1/60* (2013.01); *G06T 15/20* (2013.01); *G06T 15/405* (2013.01); *G06T 17/10* (2013.01); *G06T 17/20* (2013.01); *G06T 2200/04* (2013.01)

(58) Field of Classification Search
None
See application file for complete search history.

(56) References Cited

U.S. PATENT DOCUMENTS

| | | | | |
|---|---|---|---|---|
| 4,910,683 A | * | 3/1990 | Bishop | G06T 15/20 345/419 |
| 6,574,360 B1 | * | 6/2003 | Berdardini | G06T 15/40 345/419 |
| 8,576,228 B2 | * | 11/2013 | Davidson | G06T 19/00 345/419 |

(Continued)

*Primary Examiner* — Yanna Wu
(74) *Attorney, Agent, or Firm* — Womble Bond Dickinson (US) LLP

(57) ABSTRACT

A method is provided for rendering a scene including a digital three-dimensional (3D) model of a structure. The method includes traversing a scene graph composed of a hierarchical group of nodes representing respective 3D objects of the digital 3D model, and selecting nodes of the hierarchical group of nodes. The method includes adding a plurality of objects represented by the selected nodes to a render queue, performing a multiple-pass rendering of the plurality of 3D objects from the render queue. This includes in a pass of a plurality of passes, rendering a threshold portion but not all of the plurality of 3D objects to a framebuffer for output to a display device, with at least one of the plurality of 3D objects being left in the render queue after rendering the threshold portion. The method may also include a mesh simplification and/or z-occlusion.

24 Claims, 6 Drawing Sheets

(56) References Cited

U.S. PATENT DOCUMENTS

2007/0182734 A1* 8/2007 Levanon .............. G06T 17/005
 345/420
2012/0260157 A1* 10/2012 Zhu .................. G06F 17/30902
 715/234
2013/0330055 A1* 12/2013 Zimmermann .... H04N 1/00127
 386/240

* cited by examiner

MULTIPLE-PASS RENDERING OF A DIGITAL THREE-DIMENSIONAL MODEL OF A STRUCTURE

TECHNOLOGICAL FIELD

The present disclosure relates generally to rendering of a digital three-dimensional (3D) model of a structure and, in particular, to multiple-pass rendering of a digital 3D model of a structure such as an aircraft.

BACKGROUND

In the past, engineers who designed and maintained aircraft created or relied on detailed two-dimensional (2D) drawings of all the aircraft parts on large sheets of Mylar or similar media in which the drawings were numbered in a logical manner. This logical numbering of drawings enabled engineers, technicians and maintenance persons familiar with the drawing organization (or, "drawing tree") to locate the design details of a system (e.g., main landing gear, hydraulic pump) to facilitate a number of functions from manufacture to troubleshooting to assembly/disassembly for maintenance.

Many large and complex aircraft and other similar structures are today designed using computer aided design (CAD) software that enables the digital design and display of the structure in three-dimensions (3D). Display of an aircraft and its parts in 3D has many advantages over 2D drawings. As compared to 2D drawings, a 3D display enables engineers, technicians and maintenance persons to more easily understand how the aircraft is assembled and it makes it much easier to visualize individual parts and find out information about the part (e.g., part number and part name).

Notwithstanding its improvement over 2D drawings, a 3D model of a large and complex structure such as an aircraft presents its own challenges. The 3D model of a modern aircraft composed of millions of individual parts may be greater than 4 terabytes in size. The size of the 3D model and limitations of computing hardware make it difficult, if even possible, to view all of the parts at one time. Unless the user has access to a super-computer, which is not commonly available, the user cannot view the entire aircraft at one time.

Therefore it would be desirable to have a system and method that takes into account at least some of the issues discussed above, as well as other possible issues.

BRIEF SUMMARY

Example implementations of the present disclosure are directed to an improved apparatus, method and computer-readable storage medium for multiple-pass rendering of a digital 3D model of a structure such as an aircraft. Example implementations may enable engineers, technicians and maintenance persons to access at least some of the valuable 3D information about parts that is available in a 3D model of an aircraft or other structure, in order to easily find information about its parts (e.g., part numbers and names). Example implementations may enable a maintenance person working on an aircraft or other structure to access a 3D model of an entire aircraft using commonly available hardware such as a laptop or tablet computer in order to easily look up information (e.g., the part number, part name, maintenance information, etc.) about a specific aircraft part or system, especially while on-site at the aircraft.

The present disclosure thus includes, without limitation, the following example implementations. In some example implementations, a method is provided that includes loading, by an apparatus including a processor and a memory storing computer-readable program code portions executable by the processor, a scene graph composed of a hierarchical group of nodes representing respective 3D objects of the digital 3D model; traversing, by the apparatus, the scene graph and selecting nodes of the hierarchical group of nodes, the nodes so selected representing a plurality of 3D objects of the respective 3D objects of the digital 3D model; adding, by the apparatus, the plurality of 3D objects to a render queue; and performing, by the apparatus, a multiple-pass rendering of the plurality of 3D objects from the render queue, performing the multiple-pass rendering including in a pass of a plurality of passes, rendering a threshold portion but not all of the plurality of 3D objects to a framebuffer for output to a display device, at least one of the plurality of 3D objects being left in the render queue after rendering the threshold portion.

In some example implementations of the method of the preceding or any subsequent example implementation, or any combination thereof, the method further comprises approximating the respective 3D objects with respective 3D meshes including a plurality of 3D meshes approximating the plurality of 3D objects, wherein adding the plurality of 3D objects to the render queue includes adding the plurality of 3D meshes to the render queue, and wherein rendering the threshold portion but not all of the plurality of 3D objects includes rendering the threshold portion but not all of the plurality of 3D meshes to the framebuffer for output to the display device, at least one of the plurality of 3D meshes being left in the render queue.

In some example implementations of the method of any preceding or any subsequent example implementation, or any combination thereof, approximating the respective 3D objects includes at least tessellating the digital 3D model to approximate the respective 3D objects with the respective 3D meshes composed of faces defined by a plurality of vertices; and removing at least some of the plurality of vertices, and thereby reducing in number the plurality of faces.

In some example implementations of the method of any preceding or any subsequent example implementation, or any combination thereof, performing the multiple-pass rendering includes rendering the at least one of the plurality of 3D objects left in the render queue in a succeeding pass of the plurality of passes.

In some example implementations of the method of any preceding or any subsequent example implementation, or any combination thereof, performing the multiple-pass rendering further includes in the pass of the plurality of passes, and for a 3D object of the at least one of the plurality of 3D objects left in the render queue, at least performing a comparison of a bounding geometry of the 3D object against a depth buffer for the threshold portion of the plurality of 3D objects so rendered to determine if the 3D object is occluded by the threshold portion of the plurality of 3D objects; and based on the comparison, removing the 3D object from the render queue or leaving the 3D object in the render queue for rendering in a succeeding pass of the plurality of passes.

In some example implementations of the method of any preceding or any subsequent example implementation, or any combination thereof, removing the 3D object includes removing the 3D object from the render queue without the 3D object being rendered in the pass or any succeeding pass of the plurality of passes an instance in which the comparison indicates that the 3D object is occluded, and wherein leaving the 3D object includes leaving the 3D object in the render queue for rendering in the succeeding pass in an instance in which the comparison indicates that the 3D object is not occluded.

In some example implementations of the method of any preceding or any subsequent example implementation, or any combination thereof, selecting the nodes includes selecting the nodes based on a position of a synthetic camera in the scene, and performing the multiple-pass rendering includes performing the multiple-pass rendering until the render queue is empty or the position of the synthetic camera changes.

In some example implementations of the method of any preceding or any subsequent example implementation, or any combination thereof, selecting the nodes includes selecting the nodes based on a position of a synthetic camera in the scene, and wherein the method further comprises receiving an indication of a new position of the synthetic camera; and in response thereto, resetting the render queue and thereby clearing the render queue of any 3D objects therein; and again, traversing the scene graph, adding the plurality of 3D objects, and performing the multiple-pass rendering, based on the new position of the synthetic camera.

In some example implementations, an apparatus is provided that comprises a processor and a memory storing executable instructions that, in response to execution by the processor, cause the apparatus to at least perform the method of any preceding example implementation, or any combination thereof.

In some example implementations, a computer-readable storage medium is provided. The computer-readable storage medium is non-transitory and has computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
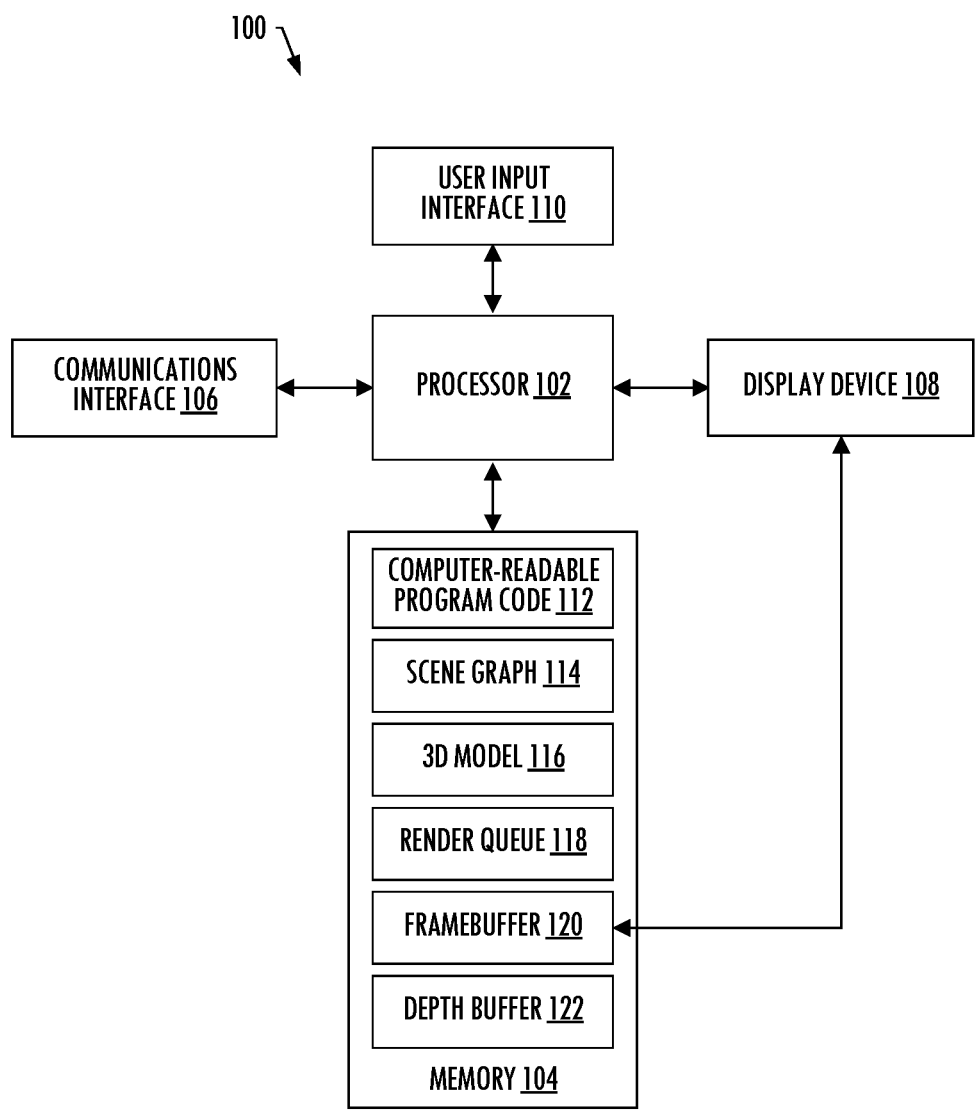
FIG. 1 illustrates an apparatus according to various example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

When creating a composite view of a large number of digital three-dimensional (3D) models it is often necessary to utilize an approach to the selection order of the individual models. When the models are complex, there is typically a visible lag, as pieces of the overall object are rendered. A number of techniques exist to address this lag, but those techniques either result in areas of the 3D model randomly popping into view, or require significant processing overhead as the complexity of the model grows. Example implementations of the present disclosure relate generally to rendering a scene including a digital 3D model of a structure such as an aircraft that takes into account at least some of the issues discussed above, as well as other possible issues.

Example implementations perform a multiple-pass rendering to increase efficiency for any complex modeling view. As highly-complex models may exceed the hardware capabilities of many current graphics systems, example implementations enable the display of these models on consumer-grade electronic devices, including smartphones, tablet computers, laptop computers and the like. The multiple-pass rendering of example implementations also enables the selection and display of more important/applicable 3D objects first, which may dramatically increase the visual responsiveness for the user regardless of the computing hardware. Example implementations make it feasible to render an entire aircraft based on its 3D engineering models on a consumer-grade electronic devices.

Example implementations will be primarily described in conjunction with aerospace applications in which the structure is an aircraft. It should be understood, however, that example implementations may be utilized in conjunction with a variety of other applications, both in the aerospace industry and outside of the aerospace industry. Other examples of suitable structures include any of a number of different types of vehicles, such as spacecraft, watercraft, motor vehicles, railed vehicles and the like. Furthermore, it should be understood that unless otherwise specified, the terms "data," "content," "information," and similar terms may be at times used interchangeably.

According to example implementations, a digital 3D model of a structure may be a 3D computer-aided design (CAD) model or other similar model (sometimes referred to as a solid model) composed of 3D objects. The 3D model and its 3D objects may represent the structure as a collection of "primitives" such as edges, faces, points (e.g., vertices) and the like, which may be arranged into polygons or other arithmetically-derived structures to reflect the geometry of surfaces, volumes or elements of the respective structure. The structure may be defined by a "boundary" representation, or collection of polygons that demarcate the space occupied by the structure, which may include sub-collections of polygons that demarcate spaces occupied by respective elements of the structure. For some structures, the 3D model may use hundreds of thousands of polygons.

According to one aspect of the present disclosure, FIG. 1 illustrates an apparatus 100 for rendering a scene including a digital 3D model of a structure. Generally, the apparatus may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 102 connected to a memory 104 and one or more of each of a number of interfaces for displaying, transmitting and/or receiving information, such as a communications interface 106, display device 108 and/or user input interface 110.

The processor 102 may include one or more general-purpose central processing units (CPUs), special-purpose processors such as graphics processing units (GPUs) or the like. In some examples, operations particular to rendering the scene including the 3D model may be particularly carried out by one or more GPUs. The memory 104 is configured to provide or otherwise store information such as, for example, data, computer programs (e.g., computer-readable program code 112) and/or other suitable information either on a temporary basis and/or a permanent basis. As described in greater detail below, the memory may provide or otherwise store a scene graph 114 for a digital 3D model 116, a render queue 118, a framebuffer 120 and/or depth buffer 122.

According to some example implementations, the apparatus includes the processor 102 and memory 104 storing executable instructions (computer-readable program code 112) that, in response to execution by the processor, cause the apparatus to perform a number of operations that the apparatus is thereby configured to perform. In some example implementations, the apparatus is caused to load the scene graph 114 composed of a hierarchical group of nodes representing respective 3D objects of the digital 3D model 116, and traverse the scene graph and select nodes of the hierarchical group of nodes such as based on a position of a synthetic camera in the scene including the 3D model. In some examples, the scene graph may be traversed in a breadth-first manner, with nodes being culled based on various criteria such as frustum tests, projected area tests and the like, with the nodes that pass the culling being thereby selected. The nodes so selected may represent a plurality of 3D objects of the respective 3D objects of the digital 3D model.

Also in some example implementations, the apparatus 100 is caused to add the plurality of 3D objects to the render queue 118, and perform a multiple-pass rendering of the plurality of 3D objects from the render queue. In a pass of a plurality of passes of this multiple-pass rendering, the apparatus is caused to render a threshold portion but not all of the plurality of 3D objects to the framebuffer 120 for output to the display device 108. After rendering the threshold portion, at least one of the plurality of 3D objects is left in the render queue, such as for a succeeding pass or removal.

The threshold portion of the plurality of 3D objects may be determined in any of a number of different manners to thereby limit the number of 3D objects rendered per-frame (pass of the multiple-pass rendering). In instances in which the scene graph 114 contains more data than may be rendered at a desired frame-rate (e.g., 66 milliseconds-per-frame/15 frames-per-second may be useful for some applications, faster rates may be desirable for other applications), only up to the threshold portion may be rendered in each frame. The threshold portion may be determined to achieve at least a desired a per-frame rendering time, certain number of rendered 3D objects or vertices per frame, or the like.

As suggested above, the creation of highly complex and detailed 3D models often requires a large amount of data to describe their shapes, particularly when the model is highly engineered such as in the case of an aircraft part. As these models are combined into a larger view for an even more complex structure such as an aircraft, the aggregate total of the data creates significant load on computing devices, particularly those intended for mobile use. Some example implementations may therefore include a mesh simplification that greatly reduces the amount of data necessary to support the display of 3D models at varying levels of fidelity/zoom resulting in speed increases of up to three times over existing approaches. The mesh simplification of example implementations may create a 3D image that appears to the user to be no different (in fidelity) than the original 3D model, but that requires less computing resources to render.

In some examples, then, the apparatus 100 may be caused to approximate the respective 3D objects with respective 3D meshes including a plurality of 3D meshes approximating the plurality of 3D objects. In some further examples, the apparatus may be caused to tessellate the digital 3D model to approximate the respective 3D objects with the respective 3D meshes composed of faces defined by a plurality of vertices, and remove at least some of the plurality of vertices, and thereby reduce in number the plurality of faces. Regardless of the particular manner of approximating the respective 3D objects, the apparatus may add the plurality of 3D meshes to the render queue 118, and render the threshold portion but not all of the plurality of 3D meshes to the framebuffer 120 for output to the display device 108, with at least one of the plurality of 3D meshes being left in the render queue.

As suggested above, in the multiple-pass rendering of some examples, the apparatus 100 may render the at least one of the plurality of 3D objects left in the render queue 118 in a succeeding pass of the plurality of passes. Or in the pass before the succeeding pass, the apparatus may remove an occluded 3D object from the render queue. In this regard, when displaying a complex 3D model, a number of 3D objects may be hidden, or occluded, by other 3D objects that are closer to the user's viewpoint. In some example implementations, the apparatus may perform a z-occlusion to identify and remove those hidden 3D objects from the rendering process, which may further reduce the computational load.

Example implementations may perform z-occlusion in a dynamic manner optimized to handle a complex, generic 3D model. As 3D objects are rendered using the multiple-pass rendering, computationally-inexpensive bounds may be calculated against the existing display. In the event any of those component bounds are not visible, it may be identified as occluded and its highly-detailed rendering omitted. This may build upon the performance gains of the traversal approach, further increasing performance.

In the event that 3D objects remain in the render queue 118, z-occlusion may take advantage of the depth buffer 112 for the rendered 3D objects. For a 3D object of the at least one of the plurality of 3D objects left in the render queue 118, then, the apparatus being caused to perform a comparison of a bounding geometry of the 3D object against the depth buffer 122 for the threshold portion of the plurality of 3D objects so rendered to determine if the 3D object is occluded by the threshold portion of the plurality of 3D objects.

The apparatus 100 may then remove the 3D object from the render queue 118 or leave the 3D object in the render queue for rendering in the succeeding pass based on the aforementioned comparison. More particularly, the apparatus may remove the 3D object from the render queue without the 3D object being rendered in the pass or any succeeding pass of the plurality of passes an instance in which the comparison indicates that the 3D object is occluded. Or the apparatus may leave the 3D object in the render queue for rendering in the succeeding pass in an instance in which the comparison indicates that the 3D object is not occluded.

In some more particular implementations, a specialized render target called an "unordered access texture" may be initialized and set to "false" for each 3D object in the render queue 118. A list of bounding boxes containing the remaining 3D objects may be analyzed, and the apparatus may output a "true" value to the render target for each bounding box that passes a depth test when rendered against the existing depth buffer 122. Any bounding box that fails the test may remain false and its 3D object may be removed from the render queue. Otherwise, the 3D objects for those bounding boxes that have a true value may remain in the render queue for rendering in the succeeding pass.

In some examples, the apparatus 100 may perform the multiple-pass rendering until the render queue 118 is empty or the position of the synthetic camera in the scene including the 3D model changes. In these examples, the apparatus may receive an indication of a new position of the synthetic camera. In response, apparatus may reset the render queue 118 and thereby clear the render queue of any 3D objects therein; and again, traverse the scene graph, add the plurality of 3D objects, and perform the multiple-pass rendering, based on the new position of the synthetic camera.

Figure 2:
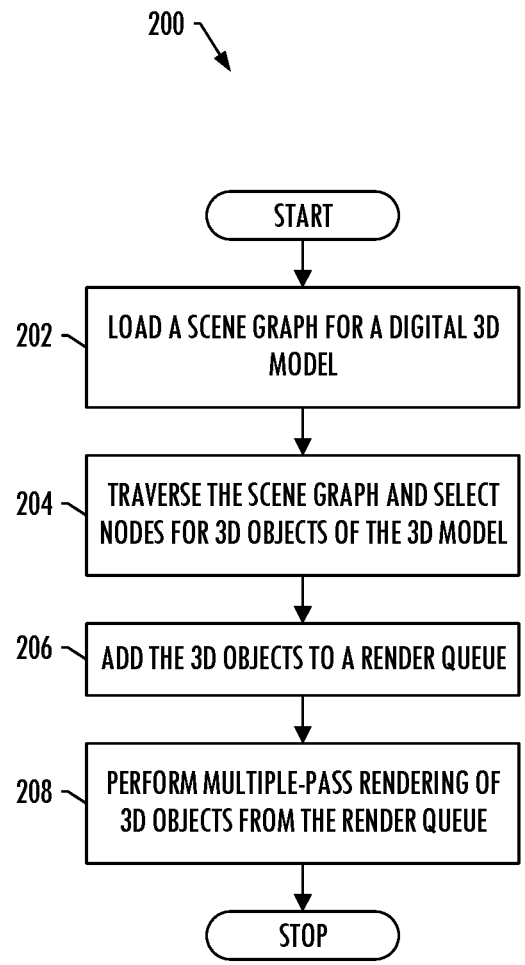
FIG. 2 is a flowchart illustrating various steps in a method according to various example implementations.

FIG. 2 is a flowchart illustrating various steps in a method 200 of rendering a scene including a 3D model 116 of a structure, according to some example implementations. As shown at block 202, the method includes loading, by an apparatus 100 including a processor 102 and a memory 104 storing computer-readable program code portions 112 executable by the processor, a scene graph 114 composed of a hierarchical group of nodes representing respective 3D objects of the digital 3D model.

As shown at block 204, the method 200 includes traversing, by the apparatus 100, the scene graph 114 and selecting nodes of the hierarchical group of nodes, with the nodes so selected representing a plurality of 3D objects of the respective 3D objects of the digital 3D model 116.

The method 200 includes adding, by the apparatus 100, the plurality of 3D objects to a render queue, as shown at block 206. And the method includes performing, by the apparatus, a multiple-pass rendering of the plurality of 3D objects from the render queue, as shown at block 208. In this regard, performing the multiple-pass rendering includes in a pass of a plurality of passes, rendering a threshold portion but not all of the plurality of 3D objects to a framebuffer for output to a display device, at least one of the plurality of 3D objects being left in the render queue after rendering the threshold portion.

Figure 3:
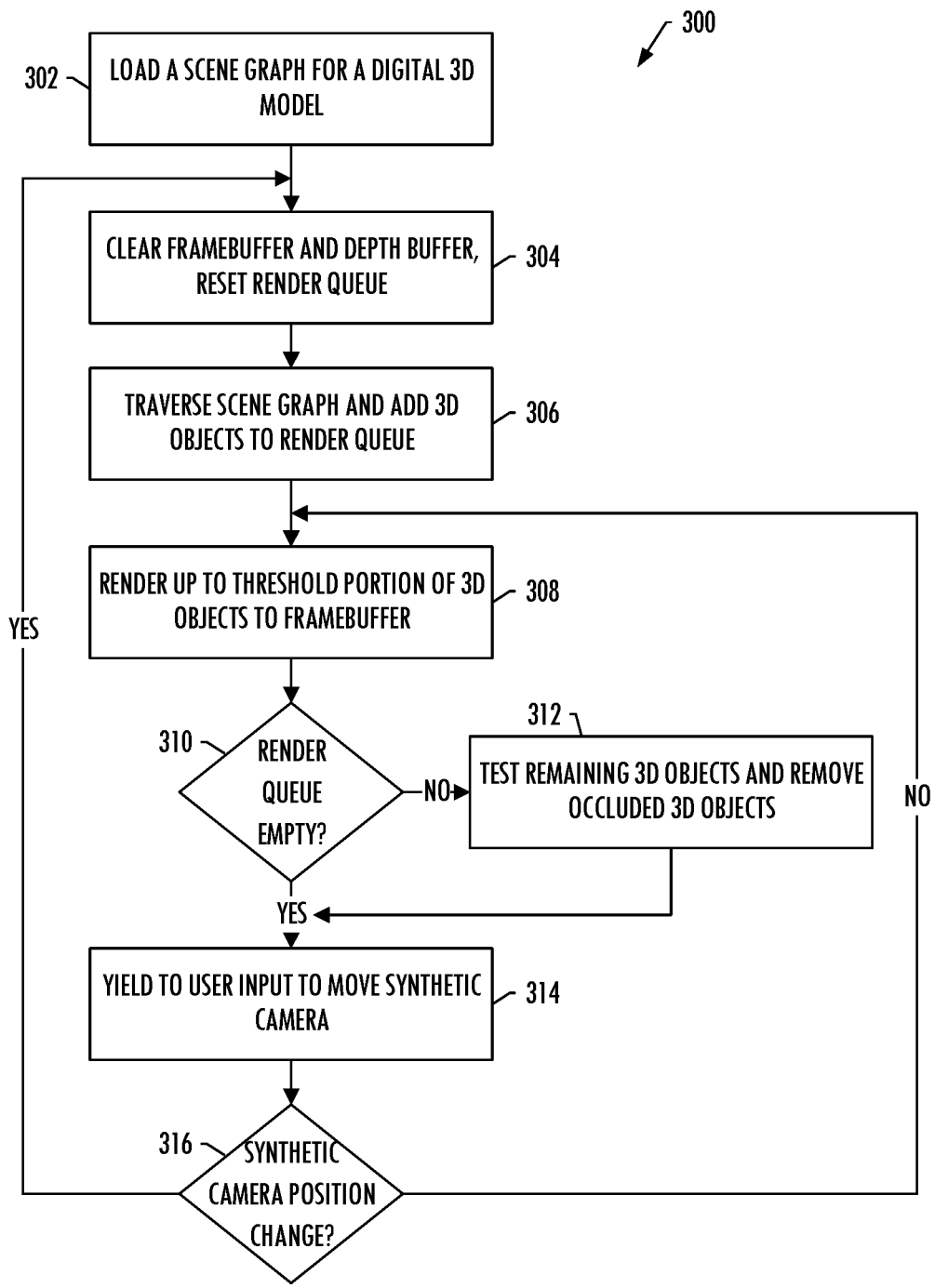
FIG. 3 is a flowchart illustrating various operations in a routine that may be performed by the apparatus of various example implementations.

To further illustrate example implementations of the present disclosure, reference is now made to FIG. 3, which is a flowchart illustrating various operations in a routine 300 that may be performed by or with the apparatus 100. As shown at blocks 302, 304, the routine may include loading a scene graph 114 composed of a hierarchical group of nodes representing respective 3D objects of the digital 3D model, clearing the framebuffer 120 and depth buffer 122, and resetting the render queue 118. The scene graph may be traversed and 3D objects added to the render queue based on the position of the synthetic camera in the scene, as shown at block 306. A multiple-pass rendering of the plurality of 3D objects from the render queue may then be performed.

For a pass of the multiple-pass rendering, up to a threshold portion of the 3D objects in the render queue 118 may be rendered to the framebuffer 120 for output to the display device 108, as shown at block 308. In at least one instance, this may include rendering the threshold portion but not all of the plurality of 3D objects in the render queue. In this instance in which the render queue is not empty (block 310), the remaining 3D objects in the render queue may be tested and those 3D objects that are occluded may be removed from the render queue, as shown at block 312. The routine 300 may then yield to user input to change the position of the synthetic camera, as shown at block 314.

In instances in which the position of the synthetic camera has not changed (block 316), the next, succeeding pass of the multiple-pass rendering may be performed, beginning with rendering up to at least the threshold portion of 3D objects (block 308). In instances in which the position of the synthetic camera has changed, the framebuffer 120 and depth buffer 122 may be cleared, and the render queue 118 reset (block 304). The routine may then repeat for the new position of the synthetic camera, beginning with traversal of the scene graph and selection of nodes based on the new position (block 306).

Figure 4A:
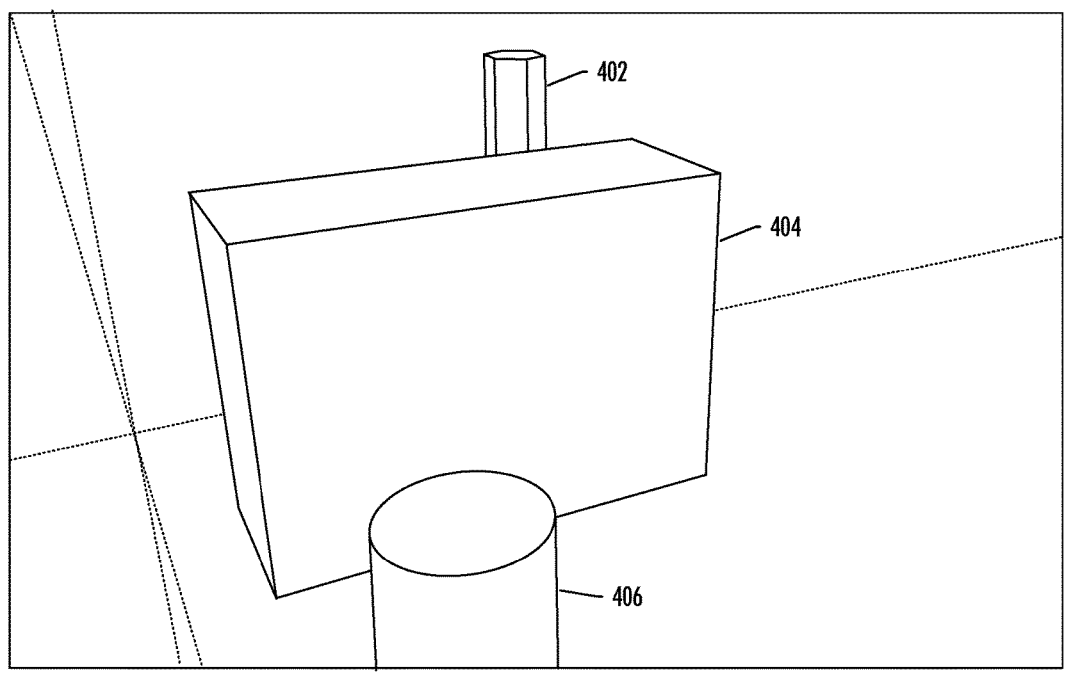
FIGS. 4A, 4B and 4C illustrate z-occlusion according to various example implementations.
Figure 4B:
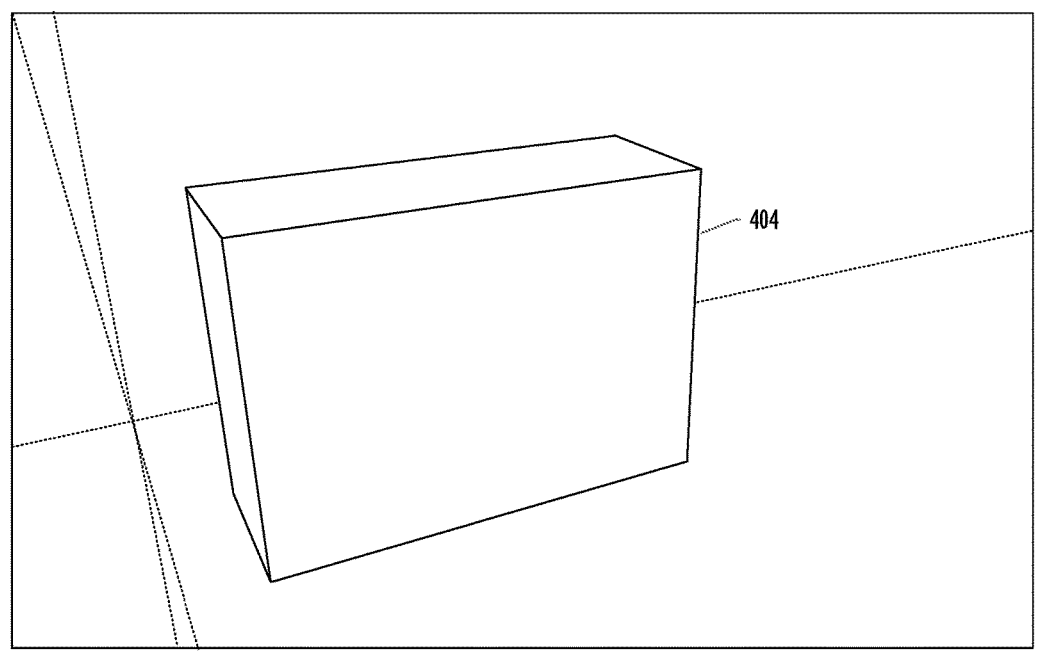
Figure 4C:
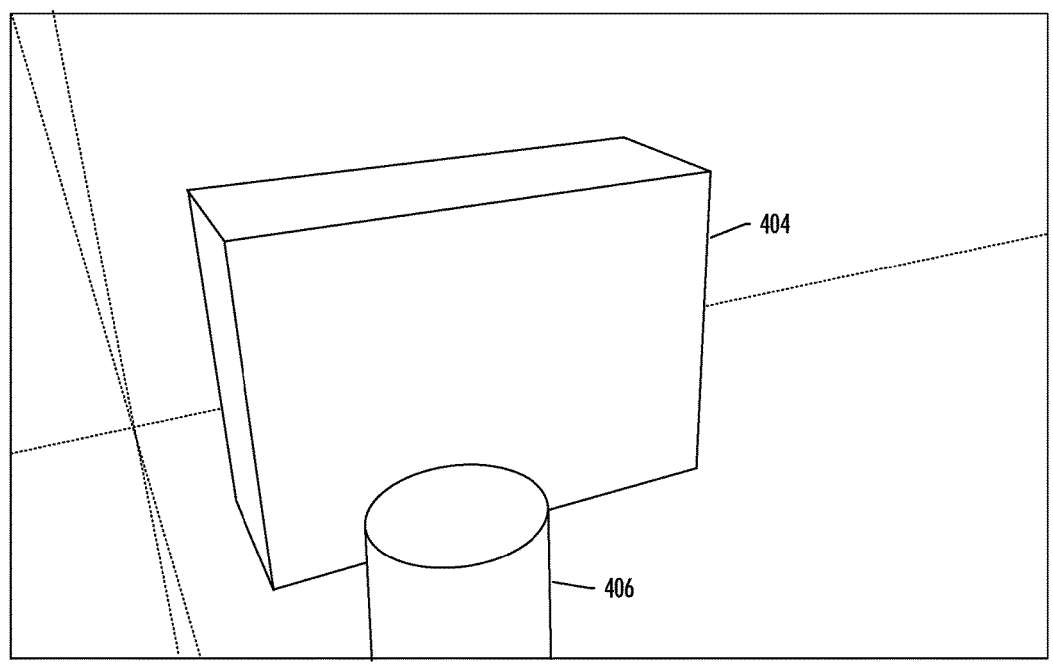

To further illustrate the aforementioned z-occlusion according to some example implementations, reference is now made to FIGS. 4A, 4B and 4C in the context of a scene graph containing 3D object A 402, 3D object B 404 and 3D object C 406, with the synthetic camera positioned behind and to the right of 3D object C, looking toward 3D object A. When populating the render queue 118, 3D objects A, B and C may pass a camera frustum cull test, and may also pass other culling tests. Because 3D object B has the largest projected size and appears near the top of the scene graph, it may be queued to render first.

Assume that after one pass of the multiple-pass rendering, the threshold portion of the 3D objects in the render queue 118 amounted to only 3D object B 404 due to is complexity, as shown in FIG. 4B. Bounding boxes for 3D objects A and C 402, 406 may be rendered against the depth buffer 122 containing 3D object B.

The apparatus 100 may output the frame shown in FIG. 4B to the display device 108, check for user input, and find that the camera position has not changed, thus allowing the apparatus to use the occlusion computations for 3D objects A and C 402, 406. Because the bounding box for 3D object A would be entirely occluded by 3D object B, none of its pixels would have passed through the occlusion test, so its entry in the unordered access texture may remain false. The bounding box for 3D object C would emit pixels due to its location in front of 3D object B, and its entry may be set to true. 3D object A may then be removed from the render queue because it will not be visible, but 3D object B may remain in the queue to be rendered in the next, succeeding pass, as shown in FIG. 4C.

As described above, the apparatus 100 of example implementations may include a processor 102, a memory 104 storing computer programs (e.g., computer-readable program code 112), a communications interface 106, a display device 108 and/or a user input interface 110. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory (of the same or another apparatus).

As indicated above, the processor 102 may include one or more CPUs, GPUs or the like. The processor may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program.

The memory 104 is generally any piece of computer hardware that is capable of storing information such as, for example, data, computer programs (e.g., computer-readable program code 112) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

The communications interface 106 may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The display device 108 may be configured to present or otherwise display information to a user, suitable examples of which include a liquid crystal display (LCD), light-emitting diode display (LED), plasma display panel (PDP) or the like. The user input interfaces 110 may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 100 may include a processor 102 and a computer-readable storage medium or memory 104 coupled to the processor, where the processor is configured to execute computer-readable program code 112 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for rendering a scene including a digital three-dimensional (3D) model of a structure, the apparatus comprising a processor and a memory storing executable instructions that, in response to execution by the processor, cause the apparatus to at least:
    load a scene graph composed of a hierarchical group of nodes representing respective 3D objects of the digital 3D model;
    traverse the scene graph and select nodes of the hierarchical group of nodes, the nodes so selected representing a plurality of 3D objects of the respective 3D objects of the digital 3D model;
    add the plurality of 3D objects to a render queue; and
    after the scene graph is traversed and the nodes are selected and the plurality of 3D objects are added to the render queue:
        perform a multiple-pass rendering of the plurality of 3D objects from the render queue, the apparatus being caused to perform the multiple-pass rendering including in a pass of a plurality of passes, the apparatus being caused to render a threshold portion but not all of the plurality of 3D objects to a framebuffer for output to a display device, at least one of the plurality of 3D objects being left in the render queue after rendering the threshold portion, the threshold portion being determined according to a specified frame rate or a specified number of 3D objects rendered per frame for rendering the plurality of 3D objects in the multiple-pass rendering.

2. The apparatus of claim 1, wherein the memory stores further executable instructions that, in response to execution by the processor, cause the apparatus to further at least approximate the respective 3D objects with respective 3D meshes including a plurality of 3D meshes approximating the plurality of 3D objects,
    wherein the apparatus being caused to add the plurality of 3D objects to the render queue includes being caused to add the plurality of 3D meshes to the render queue, and
    wherein the apparatus being caused to render the threshold portion but not all of the plurality of 3D objects includes being caused to render the threshold portion but not all of the plurality of 3D meshes to the framebuffer for output to the display device, at least one of the plurality of 3D meshes being left in the render queue.

3. The apparatus of claim 2, wherein the apparatus being caused to approximate the respective 3D objects includes being caused to at least: tessellate the digital 3D model to approximate the respective 3D objects with the respective 3D meshes composed of a plurality of faces defined by a plurality of vertices; and remove at least some of the plurality of vertices, and thereby reduce in number the plurality of faces.

4. The apparatus of claim 1, wherein the apparatus being caused to perform the multiple-pass rendering includes being caused to render the at least one of the plurality of 3D objects left in the render queue in a succeeding pass of the plurality of passes.

5. The apparatus of claim 1, wherein the apparatus being caused to perform the multiple-pass rendering further includes in the pass of the plurality of passes, and for a 3D object of the at least one of the plurality of 3D objects left in the render queue, the apparatus being caused to at least:
    perform a comparison of a bounding geometry of the 3D object against a depth buffer for the threshold portion of the plurality of 3D objects so rendered to determine if the 3D object is occluded by the threshold portion of the plurality of 3D objects; and based on the comparison,
    remove the 3D object from the render queue or leave the 3D object in the render queue for rendering in a succeeding pass of the plurality of passes.

6. The apparatus of claim 5, wherein the apparatus being caused to remove the 3D object includes being caused to remove the 3D object from the render queue without the 3D object being rendered in the pass or any succeeding pass of the plurality of passes in an instance in which the comparison indicates that the 3D object is occluded, and
    wherein the apparatus being caused to leave the 3D object includes being caused to leave the 3D object in the render queue for rendering in the succeeding pass in an instance in which the comparison indicates that the 3D object is not occluded.

7. The apparatus of claim 1, wherein the apparatus being caused to select the nodes includes being caused to select the nodes based on a position of a synthetic camera in the scene, and being caused to perform the multiple-pass rendering includes being caused to perform the multiple-pass rendering until the render queue is empty or the position of the synthetic camera changes.

8. The apparatus of claim 1, wherein the apparatus being caused to select the nodes includes being caused to select the nodes based on a position of a synthetic camera in the scene, and wherein the memory stores further executable instructions that, in response to execution by the processor, cause the apparatus to further at least:
    receive an indication of a new position of the synthetic camera; and in response thereto,
    reset the render queue and thereby clear the render queue of any 3D objects therein; and again,
    traverse the scene graph, add the plurality of 3D objects, and perform the multiple-pass rendering, based on the new position of the synthetic camera.

9. A method of rendering a scene including a digital three-dimensional (3D) model of a structure, the method comprising:
    loading, by an apparatus including a processor and a memory storing computer-readable program code portions executable by the processor, a scene graph composed of a hierarchical group of nodes representing respective 3D objects of the digital 3D model;

traversing, by the apparatus, the scene graph and selecting nodes of the hierarchical group of nodes, the nodes so selected representing a plurality of 3D objects of the respective 3D objects of the digital 3D model;

adding, by the apparatus, the plurality of 3D objects to a render queue; and after the scene graph is traversed and the nodes are selected and the plurality of 3D objects are added to the render queue:

performing, by the apparatus, a multiple-pass rendering of the plurality of 3D objects from the render queue, performing the multiple-pass rendering including in a pass of a plurality of passes, rendering a threshold portion but not all of the plurality of 3D objects to a framebuffer for output to a display device, at least one of the plurality of 3D objects being left in the render queue after rendering the threshold portion, the threshold portion being determined according to a specified frame rate or a specified number of 3D objects rendered per frame for rendering the plurality of 3D objects in the multiple-pass rendering.

10. The method of claim 9 further comprising approximating the respective 3D objects with respective 3D meshes including a plurality of 3D meshes approximating the plurality of 3D objects, wherein adding the plurality of 3D objects to the render queue includes adding the plurality of 3D meshes to the render queue, and wherein rendering the threshold portion but not all of the plurality of 3D objects includes rendering the threshold portion but not all of the plurality of 3D meshes to the framebuffer for output to the display device, at least one of the plurality of 3D meshes being left in the render queue.

11. The method of claim 10, wherein approximating the respective 3D objects includes at least: tessellating the digital 3D model to approximate the respective 3D objects with the respective 3D meshes composed of a plurality of faces defined by a plurality of vertices; and removing at least some of the plurality of vertices, and thereby reducing in number the plurality of faces.

12. The method of claim 9, wherein performing the multiple-pass rendering includes rendering the at least one of the plurality of 3D objects left in the render queue in a succeeding pass of the plurality of passes.

13. The method of claim 9, wherein performing the multiple-pass rendering further includes in the pass of the plurality of passes, and for a 3D object of the at least one of the plurality of 3D objects left in the render queue, at least:

performing a comparison of a bounding geometry of the 3D object against a depth buffer for the threshold portion of the plurality of 3D objects so rendered to determine if the 3D object is occluded by the threshold portion of the plurality of 3D objects; and based on the comparison, removing the 3D object from the render queue or leaving the 3D object in the render queue for rendering in a succeeding pass of the plurality of passes.

14. The method of claim 13, wherein removing the 3D object includes removing the 3D object from the render queue without the 3D object being rendered in the pass or any succeeding pass of the plurality of passes an instance in which the comparison indicates that the 3D object is occluded, and wherein leaving the 3D object includes leaving the 3D object in the render queue for rendering in the succeeding pass in an instance in which the comparison indicates that the 3D object is not occluded.

15. The method of claim 9, wherein selecting the nodes includes selecting the nodes based on a position of a synthetic camera in the scene, and performing the multiple-pass rendering includes performing the multiple-pass rendering until the render queue is empty or the position of the synthetic camera changes.

16. The method of claim 9, wherein selecting the nodes includes selecting the nodes based on a position of a synthetic camera in the scene, and wherein the method further comprises:

receiving an indication of a new position of the synthetic camera; and in response thereto, resetting the render queue and thereby clearing the render queue of any 3D objects therein; and again, traversing the scene graph, adding the plurality of 3D objects, and performing the multiple-pass rendering, based on the new position of the synthetic camera.

17. A computer-readable storage medium for rendering a scene including a digital three-dimensional (3D) model of a structure, the computer-readable storage medium being non-transitory and having computer-readable program code portions stored therein that in response to execution by a processor, cause an apparatus to at least:

load a scene graph composed of a hierarchical group of nodes representing respective 3D objects of the digital 3D model;

traverse the scene graph and select nodes of the hierarchical group of nodes, the nodes so selected representing a plurality of 3D objects of the respective 3D objects of the digital 3D model;

add the plurality of 3D objects to a render queue; and after the scene graph is traversed and the nodes are selected and the plurality of 3D objects are added to the render queue:

perform a multiple-pass rendering of the plurality of 3D objects from the render queue, the apparatus being caused to perform the multiple-pass rendering including in a pass of a plurality of passes, the apparatus being caused to render a threshold portion but not all of the plurality of 3D objects to a framebuffer for output to a display device, at least one of the plurality of 3D objects being left in the render queue after rendering the threshold portion, the threshold portion being determined according to a specified frame rate or a specified number of 3D objects rendered per frame for rendering the plurality of 3D objects in the multiple-pass rendering.

18. The computer-readable storage medium of claim 17 having further computer-readable program code portions stored therein that in response to execution by the processor, cause the apparatus to further at least approximate the respective 3D objects with respective 3D meshes including a plurality of 3D meshes approximating the plurality of 3D objects, wherein the apparatus being caused to add the plurality of 3D objects to the render queue includes being caused to add the plurality of 3D meshes to the render queue, and wherein the apparatus being caused to render the threshold portion but not all of the plurality of 3D objects includes being caused to render the threshold portion but not all of the plurality of 3D meshes to the framebuffer for output to the display device, at least one of the plurality of 3D meshes being left in the render queue.

19. The computer-readable storage medium of claim 18, wherein the apparatus being caused to approximate the respective 3D objects includes being caused to at least: tessellate the digital 3D model to approximate the respective 3D objects with the respective 3D meshes composed of a plurality of faces defined by a plurality of vertices; and remove at least some of the plurality of vertices, and thereby reduce in number the plurality of faces.

20. The computer-readable storage medium of claim 17, wherein the apparatus being caused to perform the multiple-pass rendering includes being caused to render the at least one of the plurality of 3D objects left in the render queue in a succeeding pass of the plurality of passes.

21. The computer-readable storage medium of claim 17, wherein the apparatus being caused to perform the multiple-pass rendering further includes in the pass of the plurality of passes, and for a 3D object of the at least one of the plurality of 3D objects left in the render queue, the apparatus being caused to at least:
perform a comparison of a bounding geometry of the 3D object against a depth buffer for the threshold portion of the plurality of 3D objects so rendered to determine if the 3D object is occluded by the threshold portion of the plurality of 3D objects; and based on the comparison,
remove the 3D object from the render queue or leave the 3D object in the render queue for rendering in a succeeding pass of the plurality of passes.

22. The computer-readable storage medium of claim 21, wherein the apparatus being caused to remove the 3D object includes being caused to remove the 3D object from the render queue without the 3D object being rendered in the pass or any succeeding pass of the plurality of passes an instance in which the comparison indicates that the 3D object is occluded, and
wherein the apparatus being caused to leave the 3D object includes being caused to leave the 3D object in the render queue for rendering in the succeeding pass in an instance in which the comparison indicates that the 3D object is not occluded.

23. The computer-readable storage medium of claim 17, wherein the apparatus being caused to select the nodes includes being caused to select the nodes based on a position of a synthetic camera in the scene, and being caused to perform the multiple-pass rendering includes being caused to perform the multiple-pass rendering until the render queue is empty or the position of the synthetic camera changes.

24. The computer-readable storage medium of claim 17, wherein the apparatus being caused to select the nodes includes being caused to select the nodes based on a position of a synthetic camera in the scene, and wherein the computer-readable storage medium has further computer-readable program code portions stored therein that in response to execution by the processor, cause the apparatus to further at least:
receive an indication of a new position of the synthetic camera; and in response thereto,
reset the render queue and thereby clear the render queue of any 3D objects therein; and again,
traverse the scene graph, add the plurality of 3D objects, and perform the multiple-pass rendering, based on the new position of the synthetic camera.

\* \* \* \* \*